(12) United States Patent
Kow

(10) Patent No.: US 9,854,655 B2
(45) Date of Patent: Dec. 26, 2017

(54) AIR STREAM CONTROLLER AND SYSTEM FOR STATIC CHARGE REDUCTION

(71) Applicant: ESD TECHNOLOGY CONSULTING & LICENSING CO., LTD., Shenzhen, Guangdong (CN)

(72) Inventor: Kek Hing Kow, Shenzhen (CN)

(73) Assignee: ESD TECHNOLOGY CONSULTING & LICENSING CO., LTD., Shenzhen (CN)

( * ) Notice: Subject to any disclaimer, the term of this patent is extended or adjusted under 35 U.S.C. 154(b) by 341 days.

(21) Appl. No.: 14/647,095

(22) PCT Filed: Nov. 14, 2013

(86) PCT No.: PCT/CN2013/087133
§ 371 (c)(1),
(2) Date: May 25, 2015

(87) PCT Pub. No.: WO2014/082529
PCT Pub. Date: Jun. 5, 2014

(65) Prior Publication Data
US 2015/0305130 A1   Oct. 22, 2015

(30) Foreign Application Priority Data

Nov. 28, 2012 (WO) ................ PCT/CN2012/085409

(51) Int. Cl.
*H05K 3/00* (2006.01)
*H05F 3/00* (2006.01)
(Continued)

(52) U.S. Cl.
CPC ............. *H05F 3/00* (2013.01); *H05K 9/0067* (2013.01); *H01T 23/00* (2013.01)

(58) Field of Classification Search
CPC .......... H05F 3/00; H05K 9/0067; H01T 23/00
See application file for complete search history.

(56) References Cited

U.S. PATENT DOCUMENTS 3,002,730 A * 10/1961 Purdy .................. F24F 3/14
  165/229
3,257,778 A *  6/1966 Flagg .................. B03C 3/78
  134/181
(Continued)

FOREIGN PATENT DOCUMENTS

CN     101554098 A    10/2009

OTHER PUBLICATIONS

International Search Report of PCT Patent Application No. PCT/CN2013/087133 dated Feb. 20, 2014.

*Primary Examiner* — Zeev V Kitov

(57) ABSTRACT

An air stream controller and a system for static charge reduction comprising such air stream controller are disclosed. The air stream controller comprises an enclosed hollow body having a first surface and a second surface, wherein, an opening is on the first surface facing an incoming tubing of a device for static charge reduction for receiving air stream from the device for static charge reduction, wherein an outgoing tubing of the device for static charge reduction is attached onto the second surface of the enclosed hollow body for discharging the air stream. A technical solution to more effectively prevent the "leaking of air stream passage" can be achieved through the design of a multi-holes structure at the air passage to more broadly expand its air sucking area coverage without increasing the original suction power.

18 Claims, 15 Drawing Sheets

(51) Int. Cl.
*H05K 9/00* (2006.01)
*H01T 23/00* (2006.01)

(56) References Cited

U.S. PATENT DOCUMENTS 7,381,245 B2 * 6/2008 Fleischer .................. A61L 9/22
                                                            422/121
2009/0114092 A1 * 5/2009 Bengtsson .............. B03C 3/025
                                                             95/75

* cited by examiner

L-Shape

First U-shape structure

Second U-shape structure

Ring-Shape

AIR STREAM CONTROLLER AND SYSTEM FOR STATIC CHARGE REDUCTION

FIELD OF THE INVENTION

The present invention relates to static charge reduction technique, and, more specific, to an air stream controller and a system for static charge reduction comprising such air stream controller.

BACKGROUND OF THE INVENTION

In a typical semiconductor manufacturing industry, microchips at a test handler are normally carried away after the testing unit through sliding down a metal shaft which is called flow channel. The intense market competition and the continual cost-down of the consumer electronics products like TV, video, computer, mobile phone and a host of other electronic devices has put great pressure for the manufacturers to aggressively seek cost-down by increasing the throughput with faster production and making smaller IC chips. This translates to a need for faster movement of the IC chips along the test handlers. Unfortunately, this increase in speed of the production process which causes higher generation of static electricity via tribo-charging leads to the sticking of the IC chips along the flow channel after testing operation due to electrostatic attraction. The need in making smaller IC chips further aggravate this problem as even minute static generation will cause sticking as the mass of the chips is now very light. Such sticking causes jamming of the machine thus seriously impedes the output and productivity of the manufacturing operation.

An earlier unpublished application PCT/CN/2011/076825 has disclosed a device for static charge reduction capable of overcoming the problem described above.

However, the solution offered in the earlier unpublished application PCT/CN/2011/076825 suffers a limitation of use in an open space system outside the said moisture controlled enclosure invention. Many work operations are indeed carried out in an open space assembly work area. The use of the device for static charge reduction in the earlier unpublished application limits to only the localized air inside the enclosure.

To overcome such limitation, an ordinary person skilled in the art may design a system such that a steady stream of controlled air stream blowing out from the incoming tubing 12 to the outgoing tubing 22 with a higher suction power positioned in line with a spaced-apart air gap to suck in the blown out air stream thereby moving the air passage from the incoming tubing 12 to the outgoing tubing 22 to form a leak-free air passage control system as shown in FIG. 21.

However, when come to a big or odd-shape object, the effectiveness of the controlled air stream passage from the incoming tubing 12 to the outgoing tubing 22 using such blow out and suck in system described in the previous paragraph will find difficulty to cover the whole object properly thereby jeopardising the effectiveness of a complete static charge neutralisation of the object to be treated.

A solution may be found by putting up more outgoing tubing stations positioned in a space-out arrangement in an attempt to achieve the complete air passage coverage of the object to be treated but the cost for such elaborated system is uneconomical and lacks commercial attractiveness.

Therefore further research and development is needed to overcome the above limitation.

SUMMARY OF THE INVENTION

The primary objective of this invention is to provide an air stream controller which is more effective in preventing the "air stream passage leakage" to achieve a more complete static charge reduction without affecting the surrounding relative humidity of the work environment.

The air stream controller according to present invention comprises an air stream controller, comprising an enclosed hollow body having a first surface and a second surface, wherein, an opening is on the first surface facing an incoming tubing of a device for static charge reduction for receiving air stream from the device for static charge reduction, wherein an outgoing tubing of the device for static charge reduction is attached onto the second surface of the enclosed hollow body for discharging the air stream. Optionally, the opening comprises a plurality of slits or holes. Optionally, the plurality of holes is jointed together to form a long slit opening or a bent or circular slit to target specific area.

Optionally, the enclosed hollow body is configured in a cube shape structure, a rectangular shape structure, an oval shape structure, a pentagon shape structure, a hexagon shape structure, a circular shape structure or an irregular shape structure.

Optionally, the enclosed hollow body is configured in an L-shape structure, and the opening is at least on a first surface of a vertical portion of the L-shape structure, and the outgoing tubing of the device for static charge reduction is attached onto a second surface of the vertical portion of the L-shape structure opposite the first surface for discharging the air stream.

Optionally, the enclosed hollow body is configured in a first U-shape structure comprising two vertical portions and one horizontal portion, the opening is at least on a first surface of the two vertical portions of the U-shape structure, and the outgoing tubing of the device for static charge reduction is attached onto a first surface of the horizontal portion of the U-shape for discharging the air stream.

Optionally, the enclosed hollow body is configured in a second U-shape structure formed by a U-shape tube, wherein, the opening is positioned along a surface facing inwards of the U-shape tube and the outgoing tubing of the device for static charge reduction is attached onto an outer side surface of the U-shape tube for discharging the air stream.

Optionally, the enclosed hollow body is configured in a ring-shape structure formed by a ring-shape tube, wherein, the opening is positioned along an inner surface of the ring-shape tube and the outgoing tubing of the device for static charge reduction is attached onto an outer side surface of the ring-shape tube for discharging the air stream.

Optionally, an external air cover or enclosure is placed over the incoming tubing or the outgoing tubing or both to cordon or block off certain amount of disruptive air-flow, wherein, the external air cover or enclosure is extensible and adjustable.

Optionally, the incoming tubing is positioned with a space gap to the first surface of the enclosed hollow body or attached to a third surface of the enclosed hollow body so as to facing the opening on the first surface.

Optionally, the enclosed hollow body is extensible and adjustable to provide flexibility to cover a broader or smaller area, the enclosed hollow body is installed with at least one air suction device to have more control over the air stream, and the air stream controller is fabricated with an enclosure.

The secondary objective of this invention is to provide an air stream controller, comprising, a first enclosed hollow body and a second enclosed hollow body, wherein, an incoming tubing of a device for static charge reduction is in flowable communication with a first surface of the first enclosed hollow body, an first opening is on a second surface of the first enclosed hollow body, a second opening is on a first surface of the second enclosed hollow body facing the second surface of the first enclosed hollow body to receive air stream coming out from the incoming tubing of a device for static charge reduction, wherein an outgoing tubing of the device for static charge reduction is attached onto a second surface of the second enclosed hollow body for discharging the air stream. Optionally, the first opening and second opening comprise a plurality of slits or holes. Optionally, the plurality of holes is jointed together to form a long slit opening or a bent or circular slit to target specific area.

Optionally, the incoming tubing is positioned with a space gap to the first surface of the first enclosed hollow body, wherein, a third opening is on the first surface of the first enclosed hollow body, or the incoming tubing is attached to the first surface of the first enclosed hollow body so as to facing the first opening on the second surface of the first enclosed hollow body.

Optionally, the first or second enclosed hollow body is configured in a cube shape structure, a rectangular shape structure, an oval shape structure, a pentagon shape structure, a hexagon shape structure, a circular shape structure or an irregular shape structure, and the first enclosed hollow body and second enclosed hollow body are separately or structurally linked together.

Optionally, the first enclosed hollow body is configured in a first U-shape structure comprising two vertical portions and one horizontal portion, the first opening is at least on a first surface of the two vertical portions facing each other in the first U-shape structure, and the incoming tubing of the device for static charge reduction is positioned on the horizontal portion of the first U-shape structure.

Optionally, the second enclosed hollow body is configured in a cube shape structure, a rectangular shape structure, an oval shape structure, a pentagon shape structure, a hexagon shape structure, a circular shape structure or an irregular shape structure.

Optionally, the second enclosed hollow body is configured in a first U-shape structure comprising two vertical portions and one horizontal portion, wherein, the second opening is at least on a first surface of the two vertical portions of the first U-shape structure, and the outgoing tubing of the device for static charge reduction is attached onto a second surface of the horizontal portion of the first U-shape structure for discharging the air stream.

Optionally, the enclosed hollow body is extensible and adjustable to provide flexibility to cover a broader or a smaller area, the enclosed hollow body is installed with at least one air suction device to have more control over the air stream, and the air stream controller is fabricated with an enclosure.

Optionally, an external air cover or enclosure is placed over the incoming tubing or the outgoing tubing or both to cordon or block off certain amount of disruptive air-flow.

The third objective of this invention is to provide a system for static charge reduction, comprising: an air steam generator for generating air stream; an incoming tubing for connecting and delivering the air stream from the air steam generator to a non-enclosed open air stream passage area, an air stream level sensor of an air stream level control unit positioned within any point of the air stream flow passage along the flow path for sensing air stream level in the flow path, an outgoing tubing with the air suction unit installed which connect to the air steam generator for forming a closed loop controlled air stream delivery system; and at least one air stream controller discussed above.

Optionally, the air steam generator is a moisture generator for generating moist air stream at a predetermined moisture level or an air ioniser for generating ionised air stream at a predetermined ionisation level and the air stream level sensor is a moisture level sensor for sensing moisture level in the flow path or an ionisation level sensor for sensing ionisation level in the flow path.

In this way, the present invention more effectively prevent the "leaking of air stream passage" through the design of a multi-holes structure to more broadly expand its air stream sucking area coverage without increasing the original suction power at the outgoing tubing. This unique structure design technically provides an effective means to adequately "wrap up" the object more easily without extra suction power. At the same time, the design is more effective in preventing the "air stream passage leakage" to achieve a more complete static charge reduction without affecting the surrounding relative humidity of the work environment.

BRIEF DESCRIPTION OF THE DRAWINGS

So as to further explain the invention, an exemplary embodiment of the present invention will be described with reference to the below drawings, wherein.

DETAILED DESCRIPTION OF THE PREFERRED EMBODIMENT

These and other advantage, aspect and novel features of the present invention, as well as details of an illustrated embodiment thereof will be more fully understood from the following description and drawings, while various embodiments of the present invention are presented by way of examples only, not limitation. In the following figures, the arrowhead refers to the direction of the air.

Figure 1A:
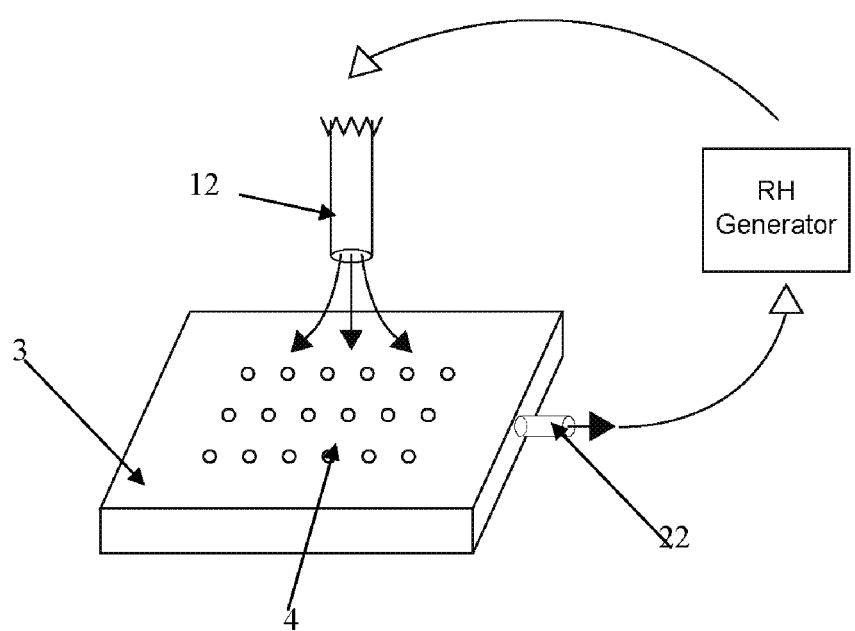
FIG. 1(a)-(c) are diagrams of the first embodiment of the air stream controller according to the present invention.

FIG. 1(a) is a diagram of the first embodiment of the air stream controller according to the present invention. As shown in FIG. 1, the air stream controller comprises an enclosed hollow body 3 having a first surface and a second surface. A plurality of holes 4 are on the first surface facing an incoming tubing 12 of a device for static charge reduction for receiving air stream from the incoming tubing 12 of a device for static charge reduction. An outgoing tubing 22 of the device for static charge reduction is attached onto the second surface of the enclosed hollow body 3 for discharging the air stream.

One skilled in the art should know that the air stream can be a moist air stream at a predetermined moisture level generated by a moisture generator made up of a water bath air bubbling unit. Or in another embodiment, the air stream can be an ionised air stream generating by an air ioniser at a predetermined ionisation level. Moreover, the air stream can comprise other moist gas or ionised gas.

According to present application, a technical solution to more effectively prevent the "leaking of air stream passage" can be achieved through the design of a multi-holes structure at the air passage to more broadly expand its air sucking area coverage without increasing the original suction power at outgoing tubing. This unique structure design technically provides an effective means to adequately "wrap up" the object more easily without extra suction power. At the same time, the design is more effective in preventing the "air stream passage leakage" to achieve a more complete static charge reduction without affecting the surrounding relative humidity of the work environment. Optionally, the enclosed hollow body is configured in a cube shape structure, a rectangular shape structure, an oval shape structure, a pentagon shape structure, a hexagon shape structure, a circular shape structure or an irregular shape structure.

One skilled in the art knows that, the plurality of holes 4 are configured in same or different shapes, such as circular shapes, rectangular shapes, oval shapes, polygonal shapes, or other regular shapes or irregular shapes. Meanwhile, the plurality of holes 4 can be arranged separately or partially overlapped. In one embodiment, the plurality of holes is jointed together to form a long slit opening to cover a wider area. One skilled in the art should further knows that although just one incoming tubing 12 and one outgoing tubing 22 are shown, there still can be more incoming tubings and outgoing tubings.

Figure 1B:
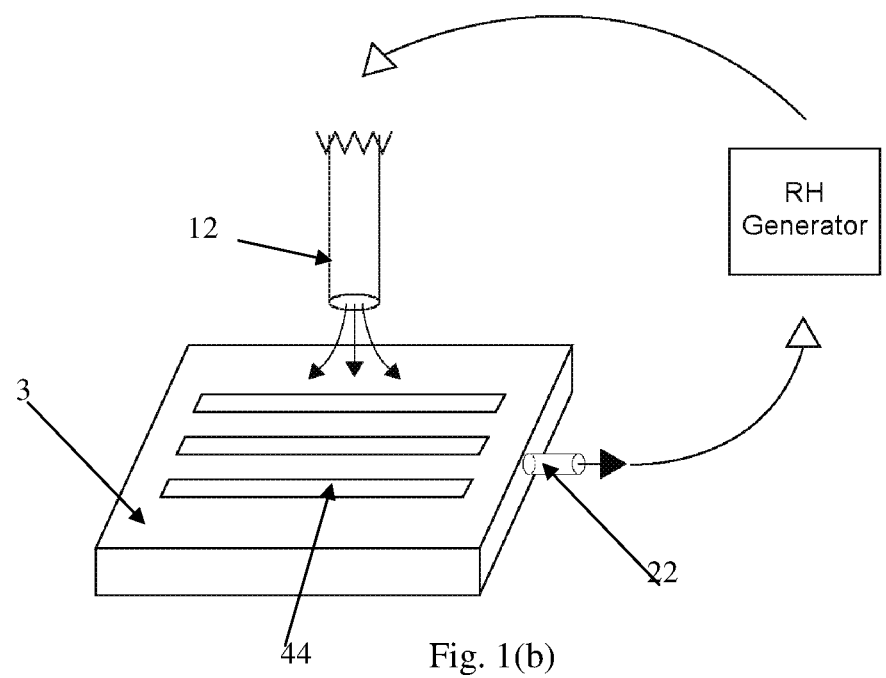

FIG. 1(b) is also a diagram of the first embodiment of the air stream controller according to the present invention. Comparing with FIG. 1 (a), the air stream controller is only different in that a plurality of slits or holes 44 is on the first surface facing an incoming tubing 12. One skilled in the art should knows that the plurality of slits 44 are configured in same or different shapes such as circular shapes, rectangular shapes, oval shapes, polygonal shapes, or other regular shapes or irregular shapes.

Figure 1C:
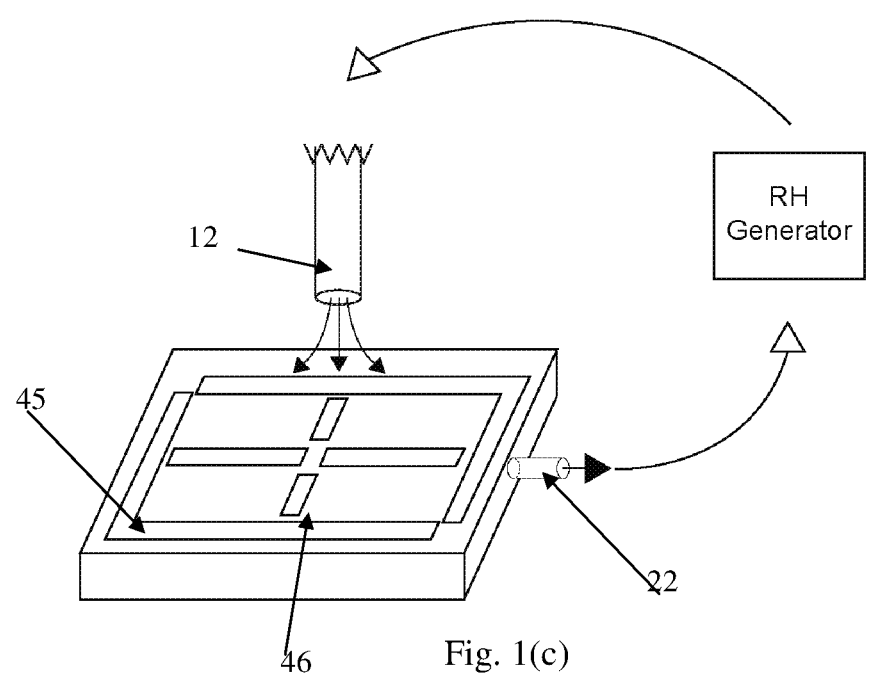

FIG. 1(c) is also a diagram of the first embodiment of the air stream controller according to the present invention. Comparing with FIG. 1 (a), the air stream controller is only different in that two L-shape slits 45 forming a rectangle frame are on the first surface facing an incoming tubing 12. In additional, four linear slits 46 in a cross shape are also on the first surface facing an incoming tubing 12. One skilled in the art knows that, besides the slits 44-46 and holes 4, other kinds of openings such as grids also may on the first surface of the enclosed hollow body 3 facing an incoming tubing 12.

Figure 2:
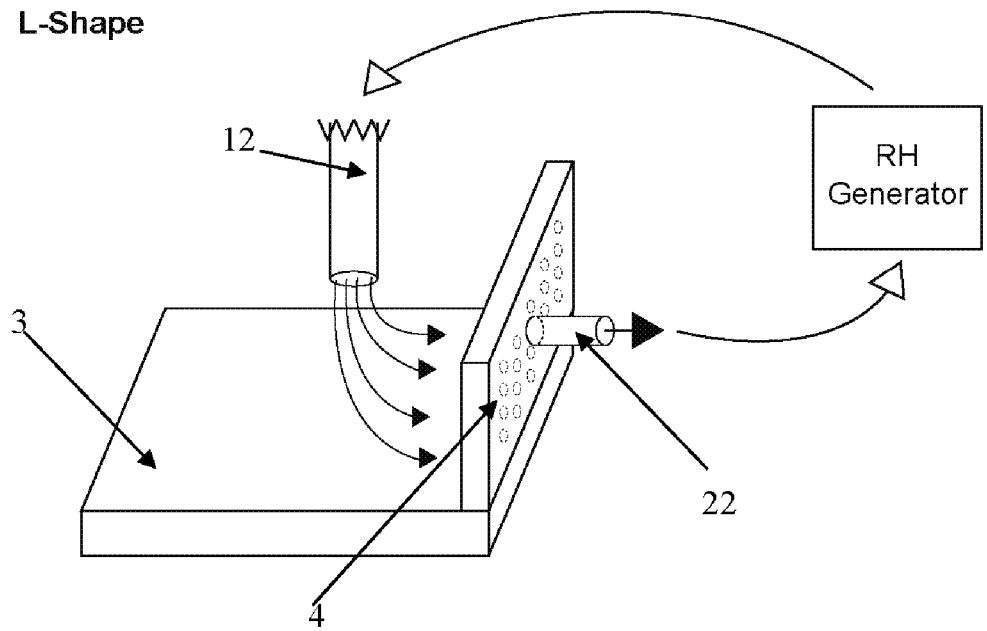
FIG. 2 is a diagram of the second embodiment of the air stream controller according to the present invention.

FIG. 2 is a diagram of the second embodiment of the air stream controller according to the present invention. Referring FIG. 2, the air stream controller comprises an enclosed hollow body 3 having a first surface and a second surface. In present embodiment, the enclosed hollow body 3 is configured in an L-shape structure. The plurality of holes 4 are on a first surface of a vertical portion of the L-shape structure facing an incoming tubing 12 of a device for static charge reduction for receiving air stream from the incoming tubing 12 of a device for static charge reduction. The outgoing tubing 22 of the device for static charge reduction is attached onto a second surface of the vertical portion of the L-shape structure opposite the first surface for discharging the air stream. One skilled in the art knows that, in a further embodiment, a plurality of holes, grids or slits is on a first surface of the horizontal portion of the L-shape structure facing the incoming tubing 12.

Figure 3A:
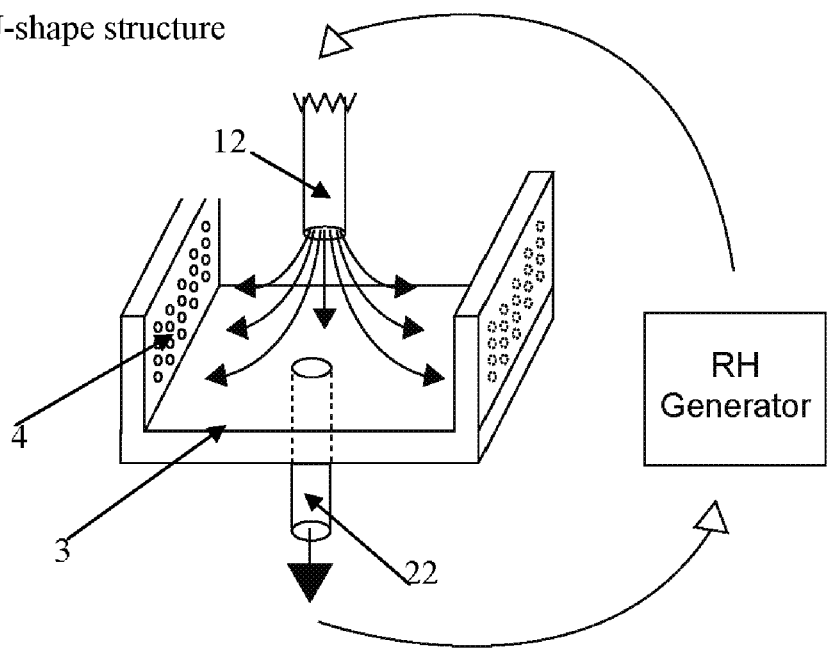
FIG. 3(a) is a diagram of the third embodiment of the air stream controller according to the present invention.

FIG. 3(a) is a diagram of the third embodiment of the air stream controller according to the present invention. Referring FIG. 3a, the air stream controller comprises an enclosed hollow body 3 having a first surface and a second surface. In present embodiment, the enclosed hollow body 3 is configured in a first U-shape structure comprising two vertical portions and one horizontal portion. The plurality of holes 4 are on a first surface of the two vertical portions of the U-shape structure facing an incoming tubing 12 of a device for static charge reduction for receiving air stream from the incoming tubing 12 of a device for static charge reduction. The outgoing tubing 22 of the device for static charge reduction is attached onto a first surface of the horizontal portion of the U-shape for discharging the air stream. One skilled in the art knows that, in a further embodiment, a plurality of holes, grids or slits is on a first surface of the horizontal portion of the first U-shape structure facing the incoming tubing 12.

Figure 3B:
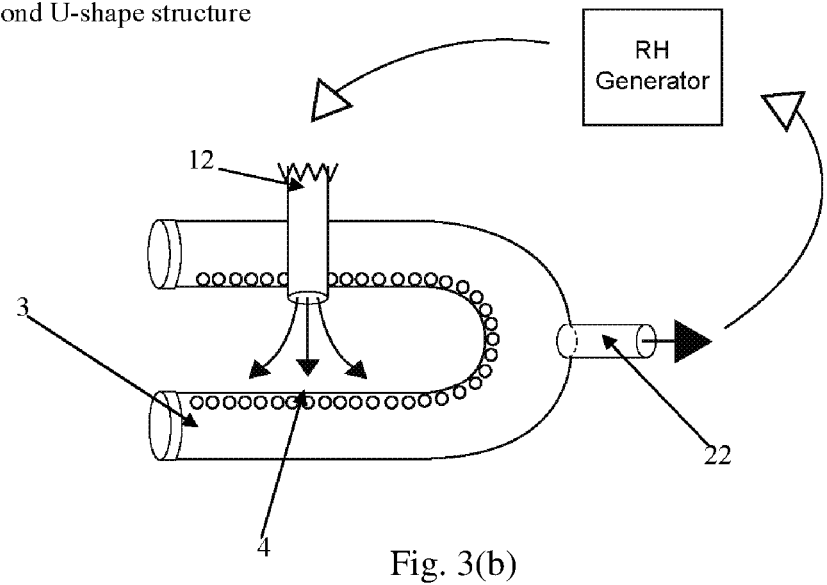
FIG. 3(b) is a diagram of the fourth embodiment of the air stream controller according to the present invention.

FIG. 3(b) is a diagram of the fourth embodiment of the air stream controller according to the present invention. Referring FIG. 3b, the enclosed hollow body 3 is configured in a second U-shape structure formed by a U-shape tube. The plurality of holes 4 are positioned along a surface facing inwards of the U-shape tube for receiving air stream from the incoming tubing 12 of a device for static charge reduction. The outgoing tubing 22 of the device for static charge reduction is attached onto an outer side surface of the U-shape tube for discharging the air stream.

Figure 4:
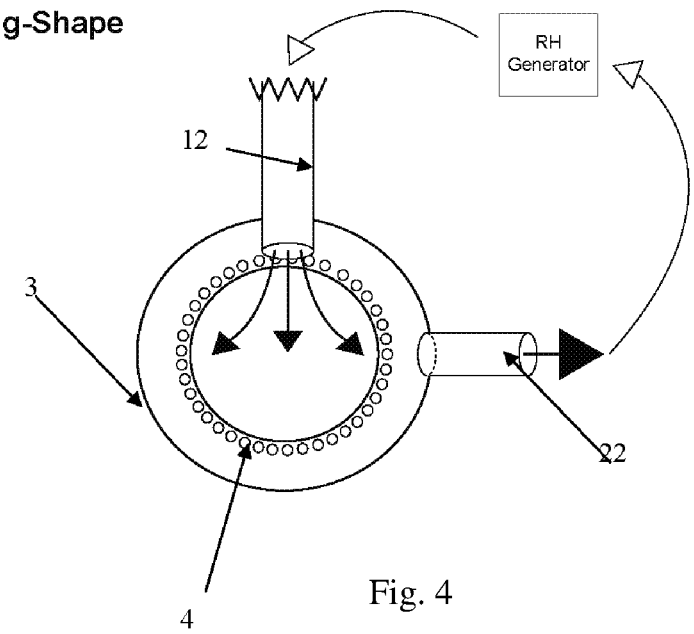
FIG. 4 is a diagram of the fifth embodiment of the air stream controller according to the present invention.

FIG. 4 is a diagram of the fifth embodiment of the air stream controller according to the present invention. Referring FIG. 4, the air stream controller comprises an enclosed hollow body 3 configured in a ring-shape structure formed by a ring-shape tube. The plurality of holes 4 are positioned along an inner surface of the ring-shape tube for receiving air stream from the incoming tubing 12 of such device for static charge reduction. The outgoing tubing 22 of the device for static charge reduction is attached onto an outer side surface of the ring-shape tube for discharging the air stream.

Figure 5A:
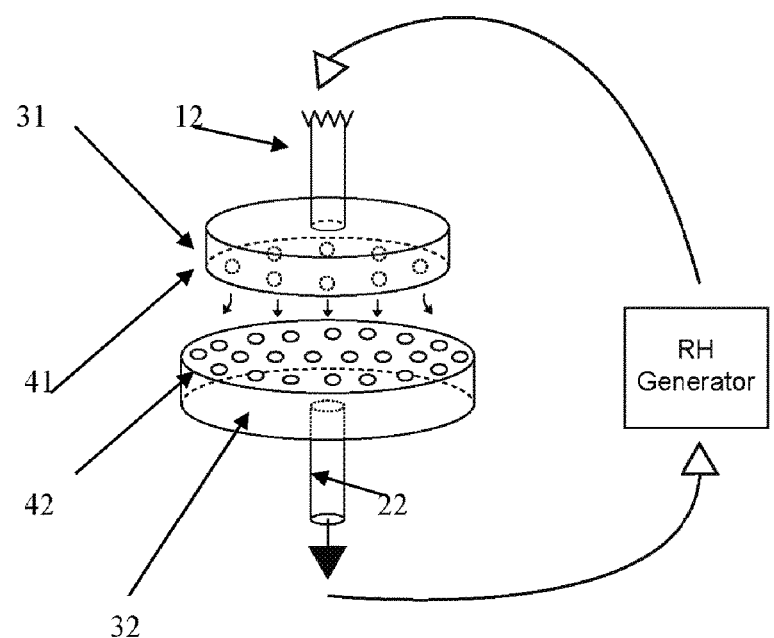
FIG. 5(a)-5(b) are diagrams of the sixth embodiment of the air stream controller according to the present invention.

FIG. 5(a) is a diagram of the sixth embodiment of the air stream controller according to the present invention. Referring FIG. 5 (a), the air stream controller comprises a first enclosed hollow body 31 and a second enclosed hollow body 32. In present embodiment, an incoming tubing 12 of a device for static charge reduction is connected onto a first surface of the first enclosed hollow body 31. A first plurality of holes 41 are on a second surface of the first enclosed hollow body 31. A second plurality of holes 42 are on a first surface of the second enclosed hollow body 32 facing the second surface of the first enclosed hollow body 31 to receive air stream coming out from the incoming tubing 12 of a device for static charge reduction. An outgoing tubing 22 of the device for static charge reduction is attached to a second surface of the second enclosed hollow body 32 for discharging the air stream.

In present embodiment, the first and second enclosed hollow bodies are configured in circular shape structure. In other embodiment, the first and second enclosed hollow bodies can be configured in a cube shape structure, a rectangular shape structure, an oval shape structure, a pentagon shape structure, a hexagon shape structure or an irregular shape structure. The first and second enclosed hollow bodies can be the same, or can be different. One skilled in the art knows that the second enclosed hollow body 32 can be part of a work table comprises an enclosed hollow plank of flat table top with plurality of holes on all or a portion of its surface facing the second surface of the first enclosed hollow body 31 to receive air stream coming out from the second surface of the first enclosed body and an outgoing tubing 22 is attached to a second surface of the work table for discharging the air stream from the work table.

Figure 5B:
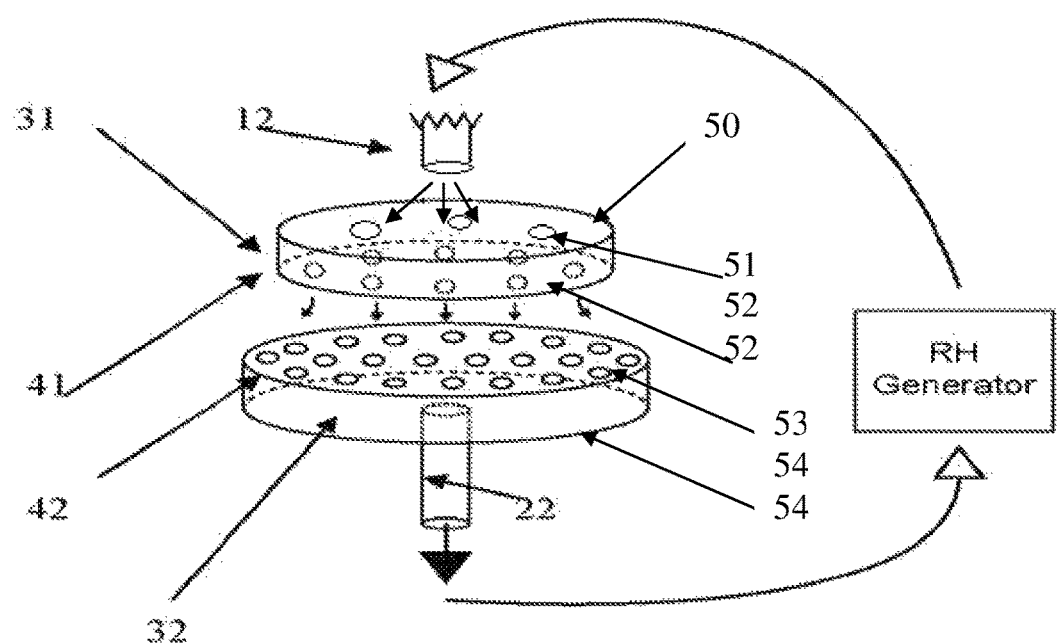

FIG. 5(b) is a diagram of the sixth embodiment of the air stream controller according to the present invention. Referring FIG. 5 (b), the air stream controller comprises a first enclosed hollow body 31 and a second enclosed hollow body 32. In present embodiment, an incoming tubing 12 of a device for static charge reduction is arranged at a distance away from the first surface 50 of the first enclosed hollow body 31. A plurality of holes 51 is on the first surface 50 of the first enclosed hollow body 31 for receiving air stream from the incoming tubing 12. A plurality of holes 41 are on a second surface 52 of the first enclosed hollow body 31. A plurality of holes 42 are on a first surface 53 of the second enclosed hollow body 32 facing the second surface 52 of the first enclosed hollow body 31 to receive air stream coming out from the incoming tubing 12 of a device for static charge reduction. An outgoing tubing 22 of the device for static charge reduction is attached to a second surface 54 of the second enclosed hollow body 32 for discharging the air stream.

In present embodiment, the first and second enclosed hollow bodies are configured in circular shape structure. In other embodiment, the first and second enclosed hollow bodies can be configured in a cube shape structure, a rectangular shape structure, an oval shape structure, a pentagon shape structure, a hexagon shape structure or an irregular shape structure. The first and second enclosed hollow bodies can be the same, or can be different.

Figure 6:
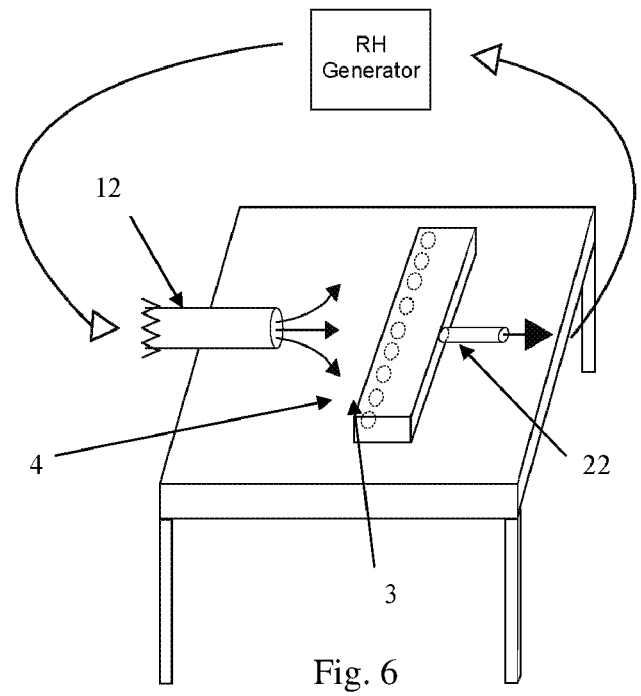
FIG. 6 is a diagram of the seventh embodiment of the air stream controller according to the present invention.

FIG. 6 is a diagram of the seventh embodiment of the air stream controller according to the present invention. The seventh embodiment of the air stream controller is similar as that in the first embodiment in FIG. 1, the difference only lies in that the enclosed hollow body 3 is a rectangular shape with a much longer length to maximise its receiving air stream coverage to achieve more specific application. Optionally, the holes of the enclosed hollow body 3 can be jointed together to form a long slit opening to cover a wider area or a bent or circular slit to target specific area to achieve yet more specific application (diagram not shown). Optionally, the incoming tubing 12 can be re-designed form a long slit opening to cover a wider area to achieve yet more specific application (diagram not shown).

Figure 7:
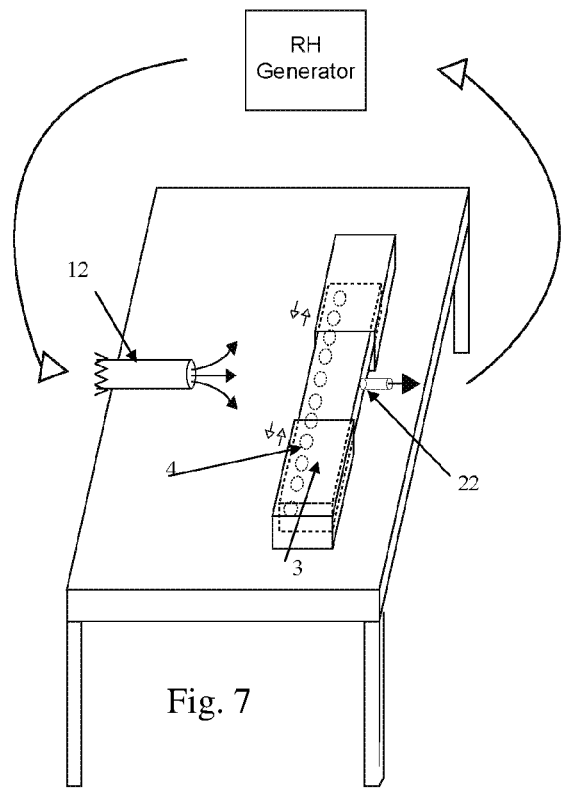
FIG. 7 is a diagram of the eighth embodiment of the air stream controller according to the present invention.

FIG. 7 is a diagram of the eighth embodiment of the air stream controller according to the present invention. The eighth embodiment of the air stream controller is similar as that in the seventh embodiment in FIG. 6, the difference only lies in that the enclosed hollow body 3 is designed as an extensible or adjustable structure with extension column(s) or arm(s) in one or more directions to cover a broader or smaller area of coverage with good flexibility in achieving a specific application.

Figure 8:
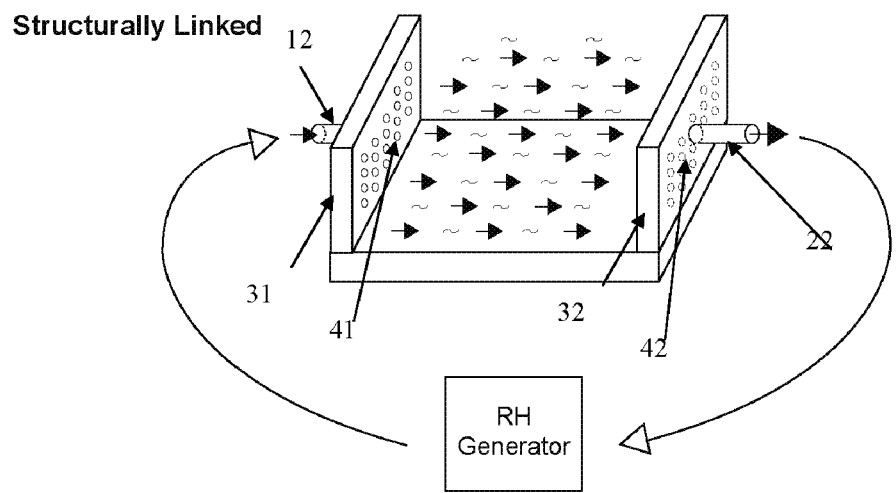
FIG. 8 is a diagram of the ninth embodiment of the air stream controller according to the present invention.

FIG. 8 is a diagram of the ninth embodiment of the air stream controller according to the present invention. Referring FIG. 8, the air stream controller comprises a first enclosed hollow body 31 and a second enclosed hollow body 32. In present embodiment, an incoming tubing 12 of a device for static charge reduction is connected onto a first surface of the first enclosed hollow body 31. A first plurality of holes 41 are on a second surface of the first enclosed hollow body 31 for releasing the air stream from the incoming tubing 12 of a device for static charge reduction. A second plurality of holes 42 are on a first surface of the second enclosed hollow body 32 facing the second surface of the first enclosed hollow body 31 for receiving the air stream from the incoming tubing 12 of a device for static charge reduction. An outgoing tubing 22 of the device for static charge reduction is attached to a second surface of the second enclosed hollow body 32 for discharging the air stream.

Figure 9A:
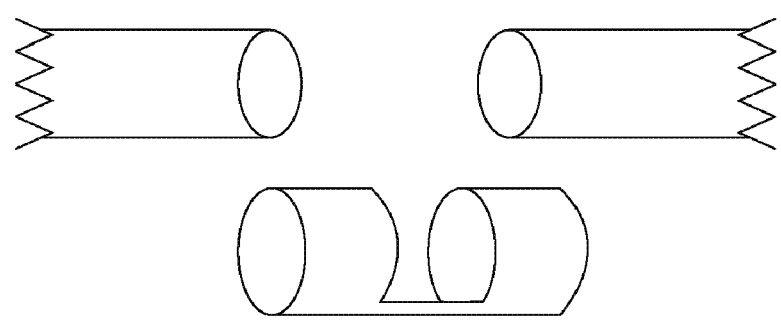
FIG. 9(a) and FIG. 9(b) shows the incoming tubing and outgoing tubing according to the present invention.
Figure 9B:
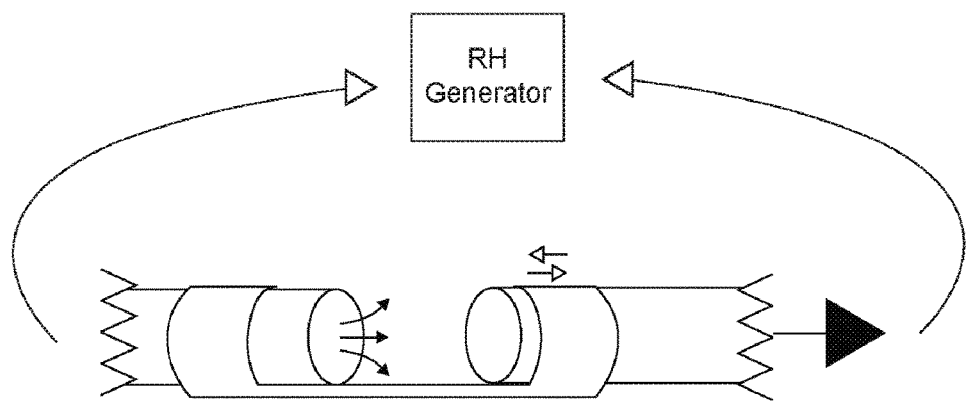

In present embodiment, the first and second enclosed hollow bodies 31 and 32 are configured in rectangular shape. One skilled in the art knows that the first and second enclosed hollow bodies 31 and 32 can be semi-circle shape or any other shape cited in the various paragraph of the current invention. Furthermore, the first enclosed hollow body and second enclosed hollow body 31 and 32 are structurally linked together. Optionally, in each embodiment of present application, the incoming tubing 12, the outgoing tubing 22 are connected with a tight-fitting tube holding structure (as shown in FIG. 9(a) and FIG. 9(b) that permits the movement of the incoming tubing 12, the outgoing tubing 22 between open space air stream passage. In anther embodiment of present invention, at least one air suction device (not shown) is installed at any point along the flow path to have more control over the air stream.

Figure 10A:
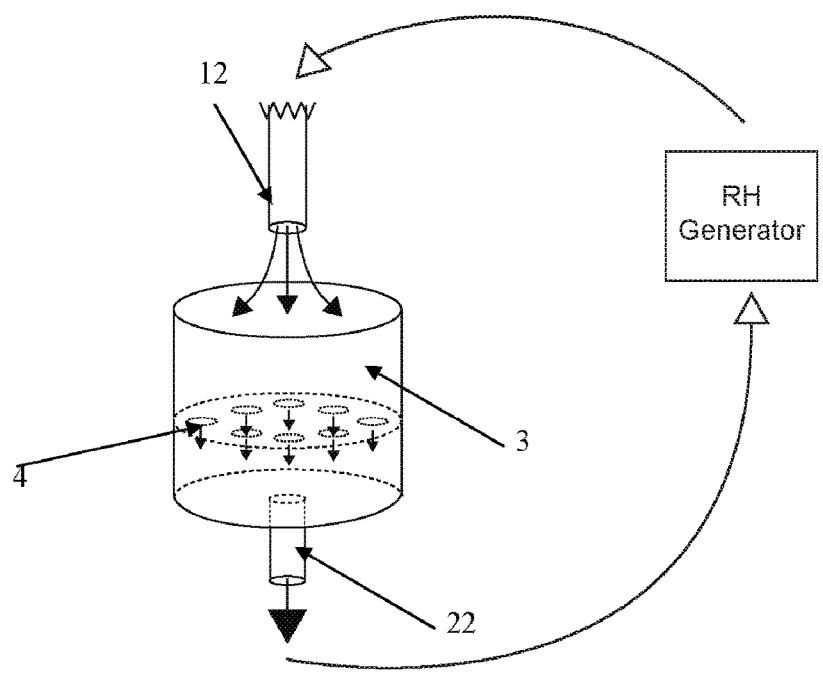
FIG. 10(a) is a diagram of the tenth embodiment of the air stream controller according to the present invention.
Figure 10B:
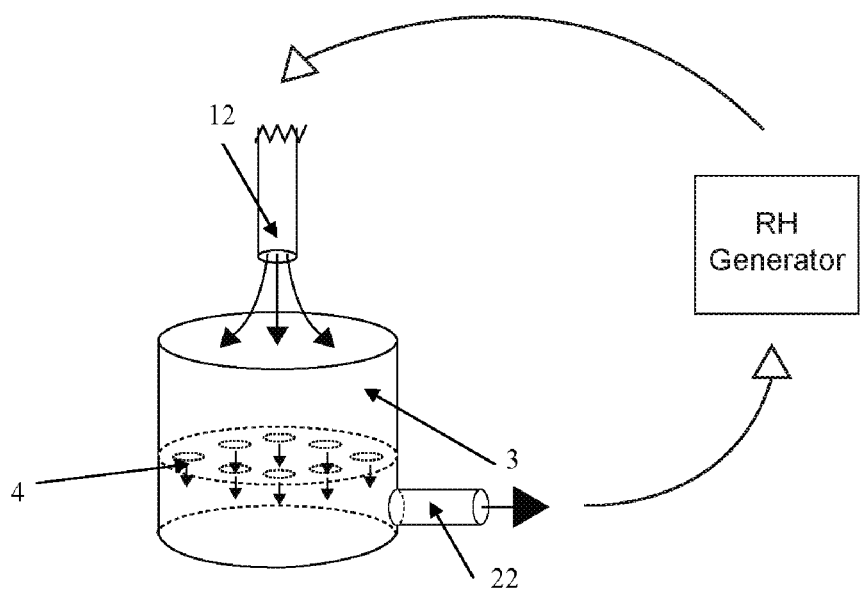
FIG. 10(b) is a diagram of the eleventh embodiment of the air stream controller according to the present invention.

FIG. 10(a) is a diagram of the tenth embodiment of the air stream controller according to the present invention and FIG. 10(b) is a diagram of the eleventh embodiment of the air stream controller according to the present invention. As shown in FIGS. 10 (a) and 10(b), the enclosed hollow body 3 is fabricated or constructed with an extra cylindrical hollow space to provide more room for work movement within the air stream passage for certain critical parts assembly operations where the assembly parts are not allowed to have any risk of touching any nearby object or work surface.

Figure 11:
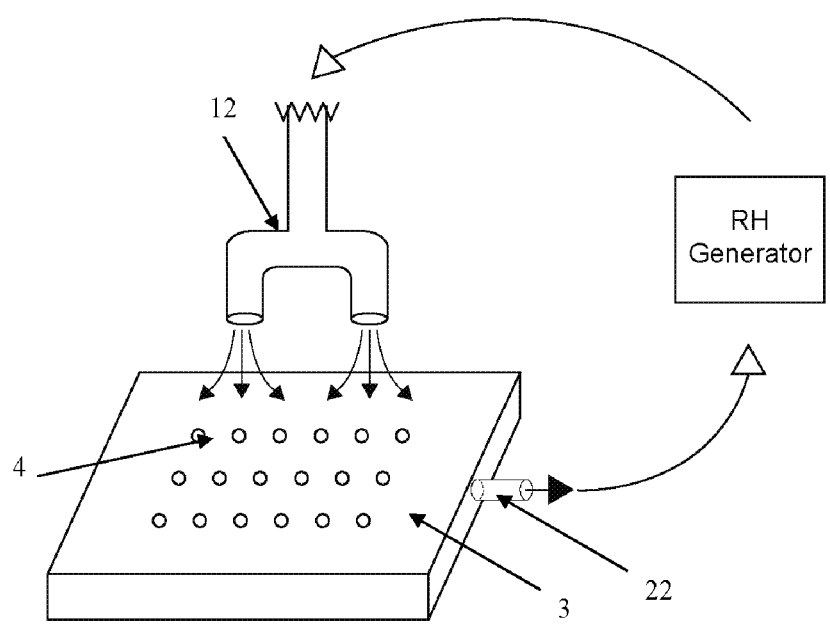
FIG. 11 is a diagram of the twelfth embodiment of the air stream controller according to the present invention.

FIG. 11 is a diagram of the twelfth embodiment of the air stream controller according to the present invention. The twelfth embodiment of the air stream controller is similar to that in the first embodiment in FIG. 1, the difference only lies in that, the incoming tubing 12 of a device for static charge reduction can be fabricated with a twin pair outlet heads to achieve yet more specific wider application.

Figure 12:
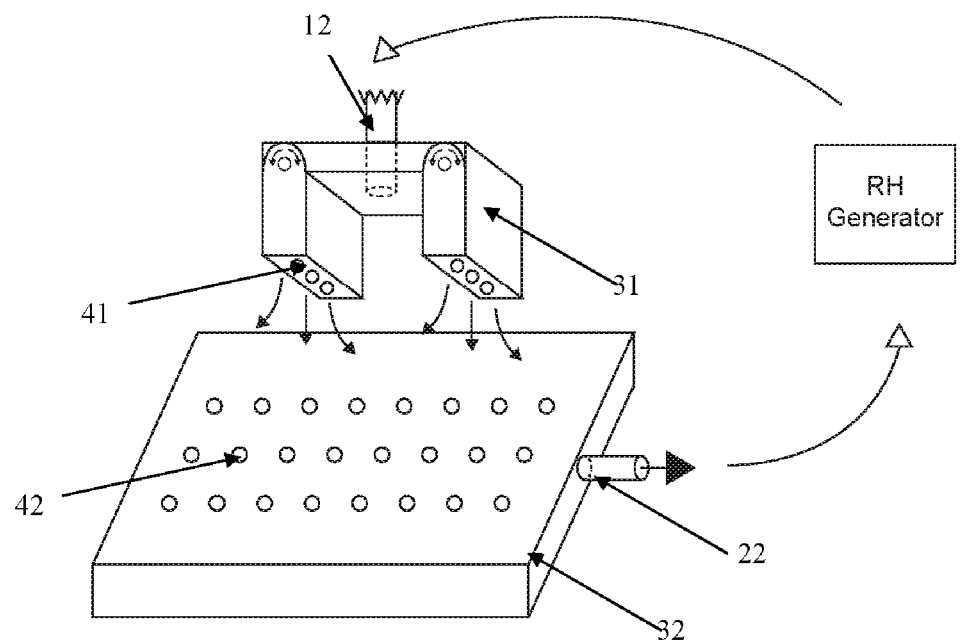
FIG. 12 is a diagram of the thirteenth embodiment of the air stream controller according to the present invention.

FIG. 12 is a diagram of the thirteenth embodiment of the air stream controller according to the present invention. As shown in FIG. 12, the air stream controller comprises a first enclosed hollow body 31 and a second enclosed hollow body 32. In the present embodiment, the first enclosed hollow body 31 is configured in a first U-shape structure comprising two vertical portions and one horizontal portion. The first plurality of holes 41 are on a first surface of the two vertical portions facing each other in the first U-shape structure. The incoming tubing 12 of the device for static charge reduction is positioned on the horizontal portion of the first U-shape structure. As shown in FIG. 12, the second enclosed hollow body 32 is configured in a rectangular shape. In other embodiment, the second enclosed hollow body 32 can be configured in a square shape, an oval shape, a pentagon shape, a hexagon shape or other regular shape or irregular shape (such as in FIG. 13 and so on).

Figure 13:
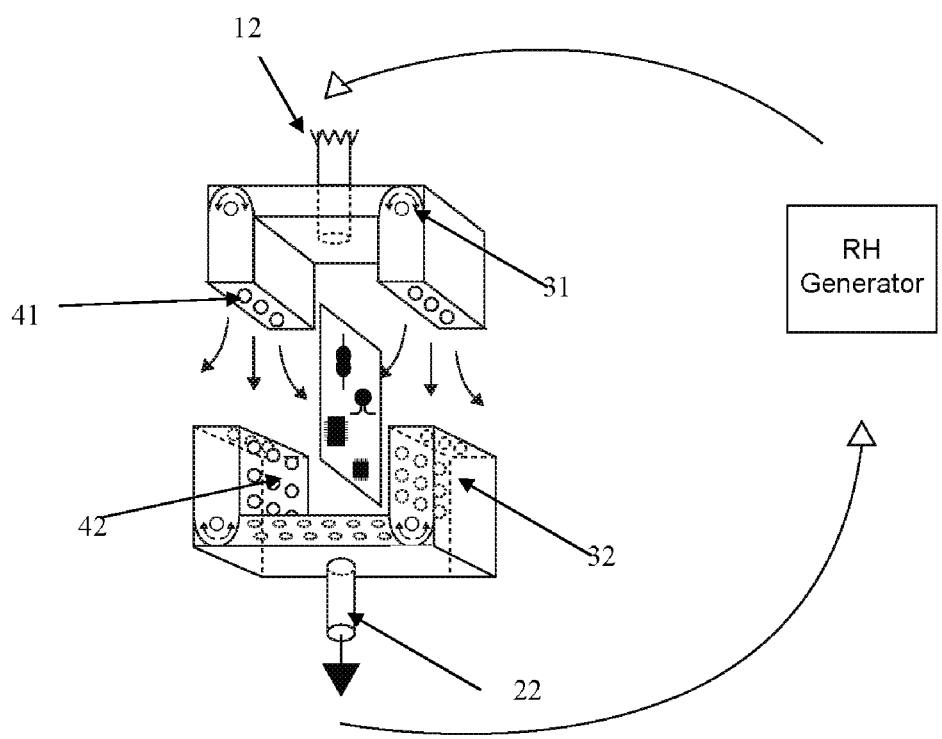
FIG. 13 is a diagram of the fourteenth embodiment of the air stream controller according to the present invention.

In another embodiment shown in FIG. 13, the second enclosed hollow body 32 can be configured in a first U-shape structure comprising two vertical portions and one horizontal portion, the second plurality of holes 42 are on a first surface of the two vertical portions and the horizontal portion of the first U-shape structure, and the outgoing tubing 22 is attach to a second surface of the horizontal portion of the first U-shape structure.

Figure 14:
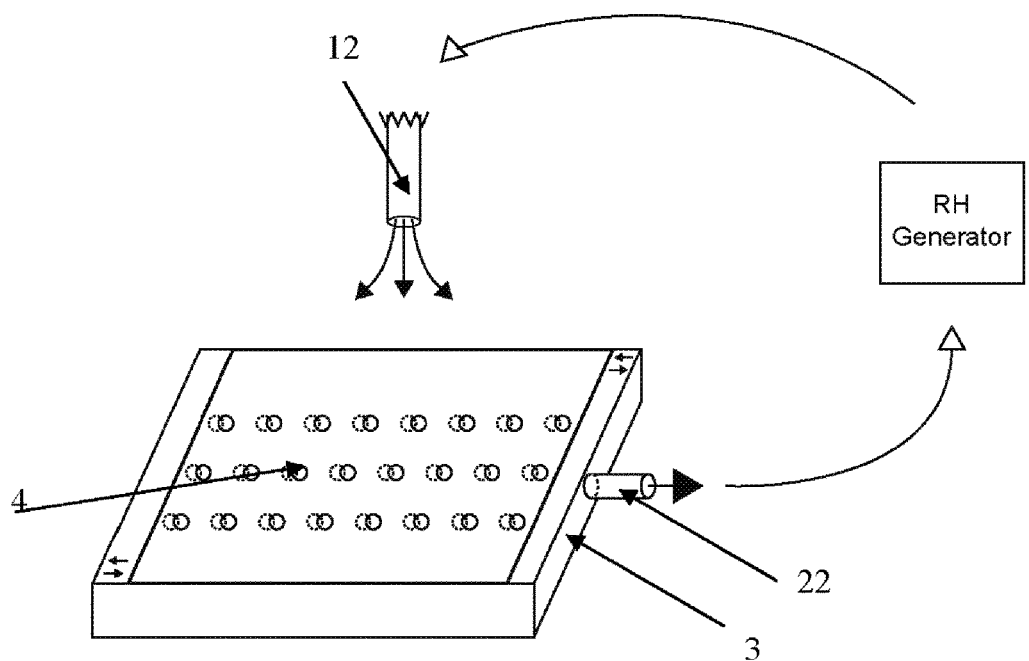
FIG. 14 is a diagram of the fifteenth embodiment of the air stream controller according to the present invention.

FIG. 14 is a diagram of the fifteenth embodiment of the air stream controller according to the present invention. The fifteenth embodiment of the air stream controller is similar as that in the first embodiment in FIG. 1 except that, the enclosed hollow body 3 is fitted with an inlet air-flow control plate or sheet as template with identical or non-identical multi-holes pattern to adjust or control the amount of inlet air by sliding or shifting the position of the inlet air-flow control template. Of course, the embodiment in FIG. 14 can be realized in each embodiment of present application according to actual requirement.

Figure 15:
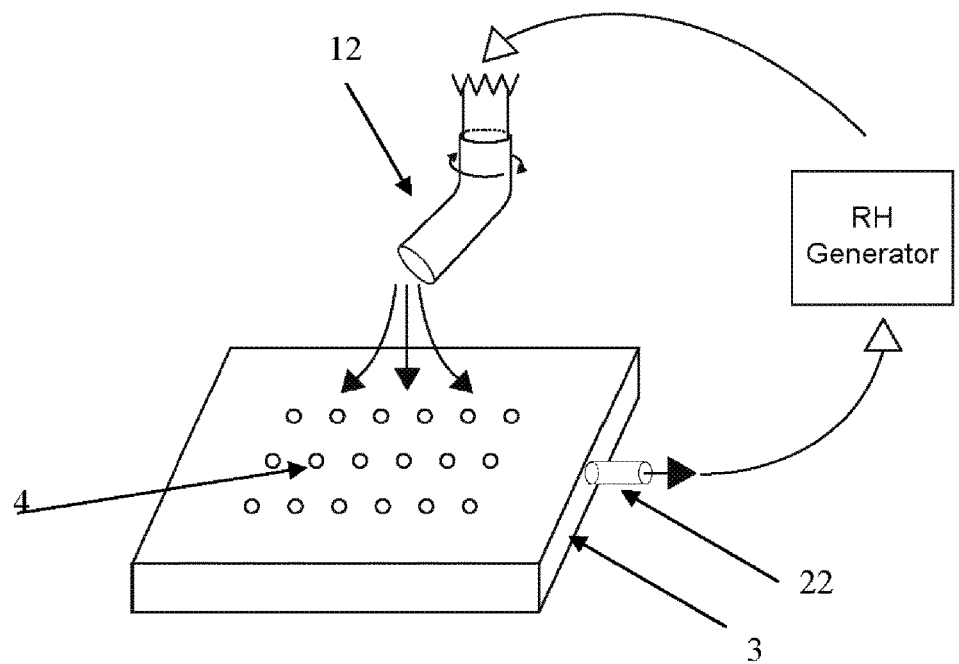
FIG. 15 is a diagram of the sixteenth embodiment of the air stream controller according to the present invention.

FIG. 15 is a diagram of the sixteenth embodiment of the air stream controller according to the present invention. The sixteenth embodiment of the air stream controller in FIG. 15 is similar to that in the first embodiment in FIG. 1, the difference is that the incoming tubing 12 of a device for static charge reduction can be fabricated with an rotatable or adjustable outlet heads to achieve yet more wider specific application.

Figure 16:
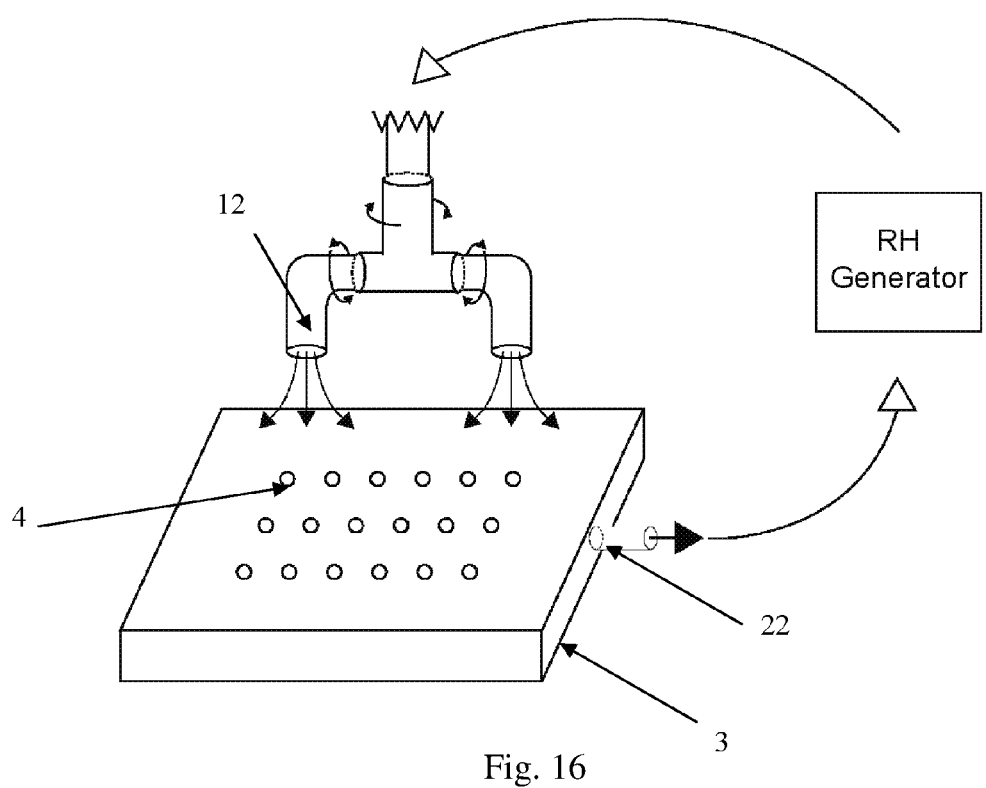
FIG. 16 is a diagram of the seventeenth embodiment of the air stream controller according to the present invention.
Figure 17A:
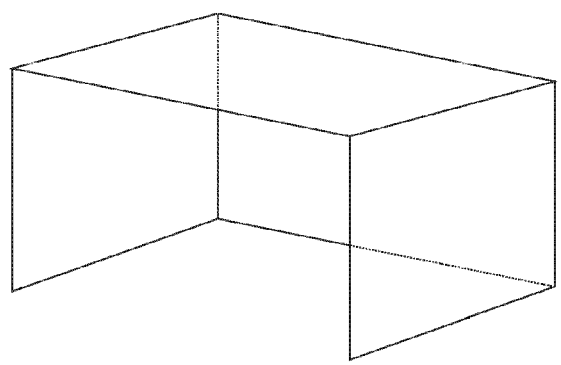
FIG. 17(a) and FIG. 17(b) shows an add-on external cover to the air stream controller according to the present invention.
Figure 17B:
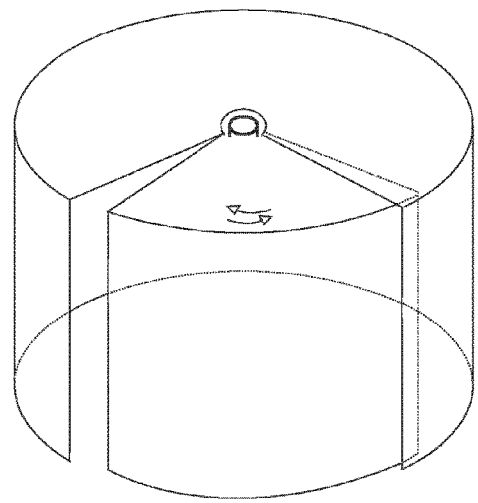

FIG. 16 is a diagram of the seventeenth embodiment of the air stream controller according to the present invention. The seventeenth embodiment of the air stream controller in FIG. 16 is similar to that in the twelfth embodiment in FIG. 11, the difference is that the incoming tubing 12 of a device for static charge reduction is fabricated with an rotatable or adjustable twin-pair outlet heads to achieve yet more wider specific application. Optionally, an external air cover or enclosure is placed over both the incoming tubing 12 and the outgoing tubing 22 to cordon or block off certain amount of disruptive air-flow that may be present in the surrounding vicinity of the RH controlled static elimination system to minimise the amount of air turbulence for better control of the open space closed-loop RH control system as shown in FIG. 17(*a*) and FIG. 17(*b*).

FIG. 18 is a diagram of the first embodiment of the system for static charge reduction according to the present invention. As shown in FIG. 18, the system for static charge reduction comprises a moisture generator for generating moist air stream at a predetermined moisture level, an incoming tubing 12 for connecting and delivering the moist air stream from the moisture generator to a non-enclosed open moist air stream passage area, a moisture level sensor of a moisture level control unit positioned within any point of the air stream flow passage along the flow path for sensing moisture level in the flow path, an outgoing tubing 31 with the air suction unit installed which connect to the moisture generator for forming a closed loop controlled air stream delivery system. The system for static charge reduction further comprises the air stream controller including an enclosed hollow body 3 having a first surface and a second surface. A plurality of holes 4 are on the first surface facing an incoming tubing 12 of a device for static charge reduction for receiving moist air stream from the incoming tubing 12 of a device for static charge reduction. The outgoing tubing 22 of the device for static charge reduction is attached onto the second surface of the enclosed hollow body 3 for discharging the moist air stream. One skilled in the art knows that a combination of two or more of the above from FIG. 1 to FIG. 16 can be used to achieve yet more flexibility and variation of applications to maximise the usefulness of the invention. One skilled in the art can figure out that the air stream controller can be comprised of a first enclosed body and a second enclosed body of identical or non-identical structures.

FIG. 19 is a diagram of the second embodiment of the system for static charge reduction according to the present invention. As shown in FIG. 19, the system for static charge reduction comprises a moisture generator 124 for generating moist air stream at a predetermined moisture level, an incoming tubing 121 for connecting and delivering the moist air stream from the moisture generator 124 to a non-enclosed open air stream passage area, a moisture level sensor 125 of a moisture level control unit positioned within any point of the moist air stream flow passage along the flow path for sensing moisture level in the flow path, an outgoing tubing 221 with the air suction unit installed which connect to the moisture generator 124 for forming a closed loop controlled moist air stream delivery system. The system for static charge reduction further comprises two air stream controllers 80 and 90. In one embodiment, the moisture generator 124 is made up of a water bath air bubbling unit. In other embodiment, the moisture generator 124 is arranged to blowing air through wet surface or ultrasonic water vapour generator for generating moist air stream.

As shown in FIG. 19, the air stream controller 80 comprises an enclosed hollow body 81 having a first surface and a second surface. A plurality of holes are on the first surface facing a tubing 123 which is connected with the incoming tubing 121. An outgoing tubing 221 is attached onto the second surface of the enclosed hollow body 80 for discharging the moist air stream.

The air stream controller 90 comprises a first enclosed hollow body 91 and a second enclosed hollow body 92. In present embodiment, a tubing 122 which is connected with the incoming tubing 121 is connected onto a first surface of the first enclosed hollow body 91. A first plurality of holes are on a second surface of the first enclosed hollow body 91. A second plurality of holes are on a first surface of the second enclosed hollow body 92 facing the second surface of the first enclosed hollow body 91 to receive moist air stream coming out from the incoming tubing 121. A tubing 222 is attached to a second surface of the second enclosed hollow body 92 for discharging the moist air stream. The tubing 222 is further attached to one a third surface of the enclosed hollow body 81. In such a way, the outgoing tubing 221 can further discharge the moist air stream from the air stream controller 90. One skilled in the art can figure out that the two air stream controllers can be constructed according to any kind of air stream controller discussed above. In another embodiment of present application, the incoming tubing 121, the tubing 122 and the tubing 123 can be fabricated as an incoming tubing with a twin pair outlet heads such as FIG. 11.

Figure 19:
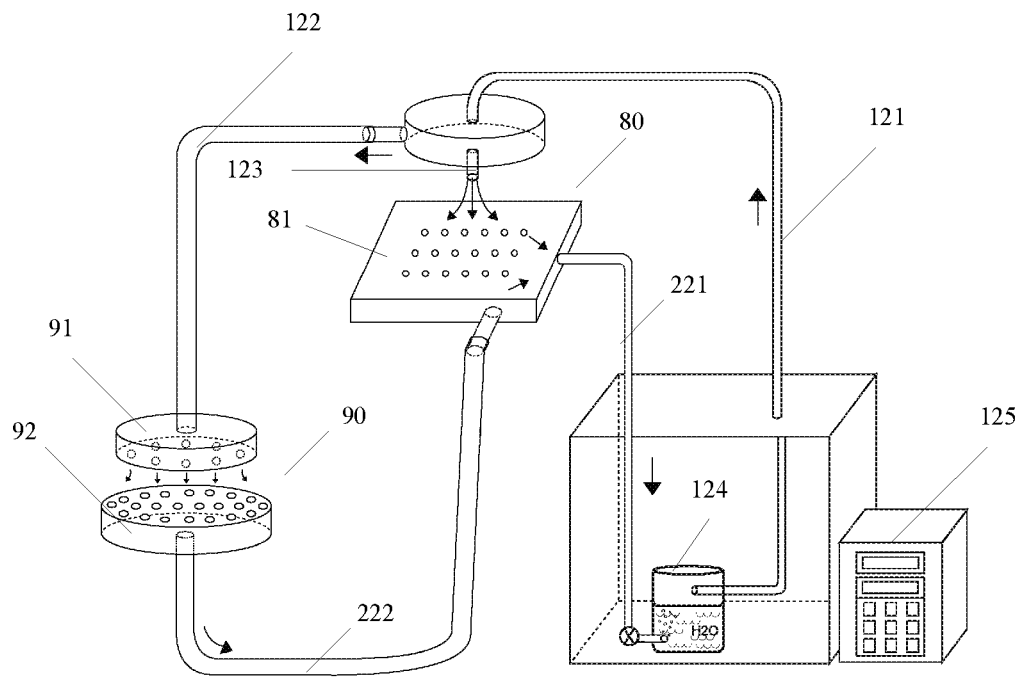
FIG. 19 is a diagram of the second embodiment of the system for static charge reduction according to the present invention.
Figure 20:
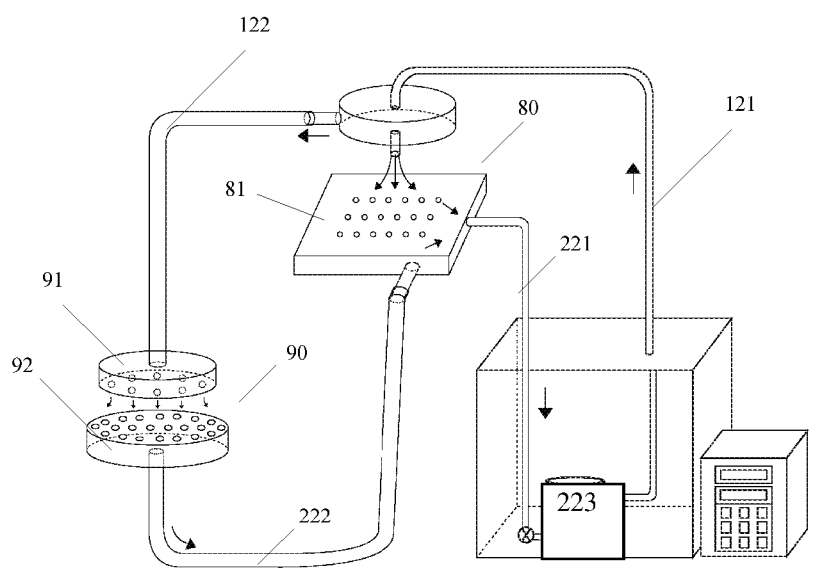
FIG. 20 is a diagram of the third embodiment of the system for static charge reduction according to the present invention.
Figure 21:
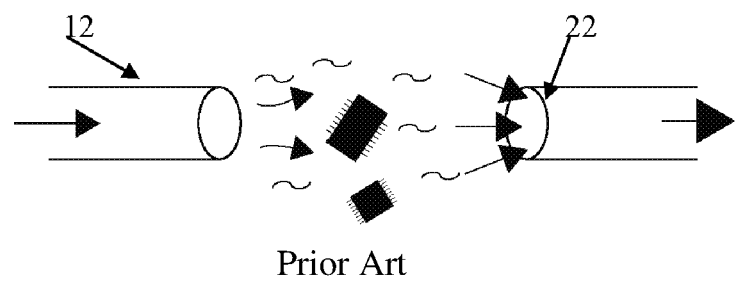
FIG. 21 is a diagram of common design of an air stream controller.

FIG. 20 is a diagram of the third embodiment of the system for static charge reduction according to the present invention. As shown in FIG. 20, the system for static charge reduction comprises an air ioniser 223 for generating ionised air stream at a predetermined ionisation level, an incoming tubing 121 for connecting and delivering the ionised air stream from the air ioniser 223 to a non-enclosed open air stream passage area, an ionisation level sensor of an ionisation level control unit positioned within any point of the ionised air stream flow passage along the flow path for sensing ionisation level in the flow path, an outgoing tubing 221 with the air suction unit installed which connect to the air ioniser 223 for forming a closed loop controlled ionised air stream delivery system. The system for static charge reduction further comprises two air stream controllers 80 and 90 which can be constructed according to FIG. 19.

Figure 18:
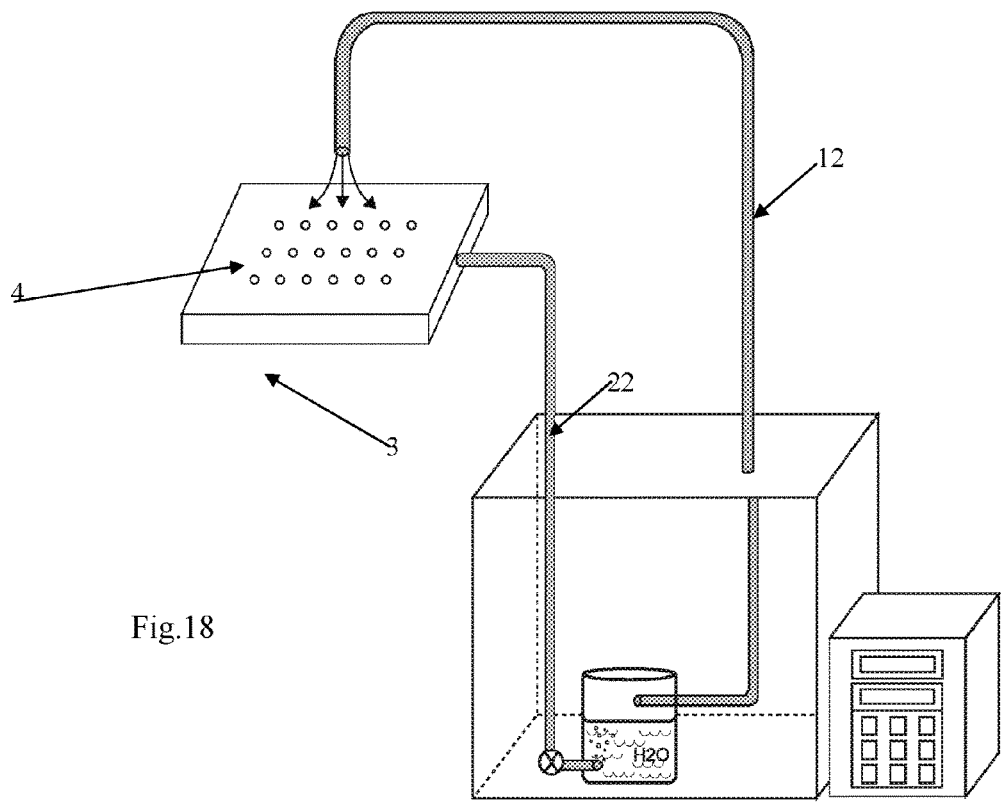
FIG. 18 is a diagram of the first embodiment of the system for static charge reduction according to the present invention.

According to present application, a technical solution to more effectively prevent the "leaking of air stream passage" can be achieved through the design of a multi-holes structure at the air inlet receiving end to more broadly expand its air sucking area coverage without increasing the original suction power at the outgoing tubing. This unique structure design technically provides an effective means to adequately "wrap up" the object more easily without extra suction power. At the same time, the design is more effective in preventing the "air stream passage leakage" to achieve a more complete static charge reduction without affecting the surrounding relative humidity of the work environment. Although not disclosed, one skilled in the art can figure out the air stream controller in the other embodiments in FIG. 2-17 also can be combined in the system for static charge reduction shown in FIG. 18-20.

While the present invention has been described with reference to several embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. An air stream controller, comprising an enclosed hollow body having a first surface and a second surface, wherein, an opening is on the first surface facing an incoming tubing of a device for static charge reduction for receiving air stream from the device for static charge reduction, wherein an outgoing tubing of the device for static charge reduction is attached onto the second surface of the enclosed hollow body for discharging the air stream;
   wherein the enclosed hollow body is configured in an L-shape structure, and the opening is at least on a first surface of a vertical portion of the L-shape structure, and the outgoing tubing of the device for static charge reduction is attached onto a second surface of the vertical portion of the L-shape structure opposite the first surface for discharging the air stream; or
   wherein the enclosed hollow body is configured in a ring-shape structure formed by a ring-shape tube, wherein, the opening is positioned along an inner surface of the ring-shape tube and the outgoing tubing of the device for static charge reduction is attached onto an outer side surface of the ring-shape tube for discharging the air stream.

2. The air stream controller according to claim 1, wherein, the opening comprises a plurality of slits or holes.

3. The air stream controller according to claim 2, wherein, the plurality of holes are jointed together to form a long slit opening or a bent or circular slit to target specific area.

4. The air stream controller according to claim 1, wherein an external air cover or enclosure is placed over the incoming tubing or the outgoing tubing or both to cordon or block off certain amount of disruptive air-flow, wherein, the external air cover or enclosure is extensible and adjustable.

5. The air stream controller according to claim 1, wherein the incoming tubing is positioned with a space gap to the first surface of the enclosed hollow body or attached to a third surface of the enclosed hollow body so as to facing the opening on the first surface.

6. The air stream controller according to claim 1, wherein, the enclosed hollow body is extensible and adjustable to provide flexibility to cover a broader or smaller area, the enclosed hollow body is installed with at least one air suction device to have more control over the air stream, and the air stream controller is fabricated with an enclosure.

7. An air stream controller, comprising an enclosed hollow body having a first surface and a second surface, wherein, an opening is on the first surface facing an incoming tubing of a device for static charge reduction for receiving air stream from the device for static charge reduction, wherein an outgoing tubing of the device for static charge reduction is attached onto the second surface of the enclosed hollow body for discharging the air stream;
   wherein the enclosed hollow body is configured in a first U-shape structure or a second U-shape structure;
   wherein the first U-shape structure comprises two vertical portions and one horizontal portion, the opening is at least on a first surface of the two vertical portions of the U-shape structure, and the outgoing tubing of the device for static charge reduction is attached onto a first surface of the horizontal portion of the U-shape for discharging the air stream;
   wherein the second U-shape structure is formed by a U-shape tube, wherein, the opening is positioned along a surface facing inwards of the U-shape tube and the outgoing tubing of the device for static charge reduction is attached onto an outer side surface of the U-shape tube for discharging the air stream.

8. The air stream controller according to claim 7, wherein, the opening comprises a plurality of slits or holes.

9. The air stream controller according to claim 8, wherein, the plurality of holes are jointed together to form a long slit opening or a bent or circular slit to target specific area.

10. The air stream controller according to claim 7, wherein an external air cover or enclosure is placed over the incoming tubing or the outgoing tubing or both to cordon or block off certain amount of disruptive air-flow, wherein, the external air cover or enclosure is extensible and adjustable.

11. The air stream controller according to claim 7, wherein the incoming tubing is positioned with a space gap to the first surface of the enclosed hollow body or attached to a third surface of the enclosed hollow body so as to facing the opening on the first surface.

12. The air stream controller according to claim 7, wherein, the enclosed hollow body is extensible and adjustable to provide flexibility to cover a broader or smaller area, the enclosed hollow body is installed with at least one air suction device to have more control over the air stream, and the air stream controller is fabricated with an enclosure.

13. An air stream controller, comprising:
a first enclosed hollow body and a second enclosed hollow body, wherein, an incoming tubing of a device for static charge reduction is in flowable communication with a first surface of the first enclosed hollow body, an first opening is on a second surface of the first enclosed hollow body, a second opening is on a first surface of the second enclosed hollow body facing the second surface of the first enclosed hollow body to receive air stream coming out from the incoming tubing of a device for static charge reduction, wherein an outgoing tubing of the device for static charge reduction is attached onto a second surface of the second enclosed hollow body for discharging the air stream;
wherein the first enclosed hollow body is configured in a first U-shape structure comprising two vertical portions and one horizontal portion, the first opening is at least on a first surface of the two vertical portions facing each other in the first U-shape structure, and the incoming tubing of the device for static charge reduction is positioned on the horizontal portion of the first U-shape structure.

14. The air stream controller according to claim 13, wherein, the second enclosed hollow body is configured in a cube shape structure, a rectangular shape structure, an oval shape structure, a pentagon shape structure, a hexagon shape structure, a circular shape structure or an irregular shape structure.

15. The air stream controller according to claim 13, wherein the second enclosed hollow body is configured in a first U-shape structure comprising two vertical portions and one horizontal portion, wherein, the second opening is at least on a first surface of the two vertical portions of the first U-shape structure, and the outgoing tubing of the device for static charge reduction is attached onto a second surface of the horizontal portion of the first U-shape structure for discharging the air stream.

16. The air stream controller according to claim 13, wherein the first opening and the second opening comprise a plurality of slits or holes.

17. The air stream controller according to claim 16, wherein the plurality of holes are jointed together to form a long slit opening or a bent or circular slit to target specific area.

18. The air stream controller according to claim 13, wherein the first enclosed hollow body or the second enclosed hollow body is extensible and adjustable to provide flexibility to cover a broader or a smaller area, the first enclosed hollow body or the second enclosed hollow body is installed with at least one air suction device to have more control over the air stream, and the air stream controller is fabricated with an enclosure.

* * * * *